United States Patent
Doris et al.

(10) Patent No.: US 8,669,145 B2
(45) Date of Patent: Mar. 11, 2014

(54) METHOD AND STRUCTURE FOR STRAINED FINFET DEVICES

(75) Inventors: Bruce B. Doris, Brewster, NY (US); Diane C. Boyd, LaGrangeville, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1468 days.

(21) Appl. No.: 10/710,272

(22) Filed: Jun. 30, 2004

(65) Prior Publication Data
US 2006/0014338 A1    Jan. 19, 2006

(51) Int. Cl.
*H01L 21/00* (2006.01)
(52) U.S. Cl.
USPC ............ 438/149; 438/197; 438/284; 438/305; 438/682; 257/E29.242
(58) Field of Classification Search
USPC ......... 438/471–477, 149, 197, 283–284, 305, 438/682; 257/E29.242
See application file for complete search history.

(56) References Cited

U.S. PATENT DOCUMENTS

| | | | |
|---|---|---|---|
| 5,461,250 A | 10/1995 | Burghartz et al. | |
| 6,342,410 B1 | 1/2002 | Yu | |
| 6,475,869 B1 | 11/2002 | Yu | |
| 6,611,029 B1 | 8/2003 | Ahmed et al. | |
| 6,909,151 B2 * | 6/2005 | Hareland et al. | 257/369 |
| 7,064,396 B2 | 6/2006 | Chen et al. | |
| 2004/0075122 A1 | 4/2004 | Lin et al. | |
| 2004/0075148 A1 * | 4/2004 | Kumagai et al. | 257/369 |
| 2004/0099903 A1 | 5/2004 | Yeo et al. | |
| 2004/0108559 A1 * | 6/2004 | Sugii et al. | 257/411 |
| 2004/0113174 A1 | 6/2004 | Chidambarrao et al. | |
| 2004/0173812 A1 * | 9/2004 | Currie et al. | 257/103 |
| 2004/0173815 A1 * | 9/2004 | Yeo et al. | 257/192 |
| 2004/0227185 A1 * | 11/2004 | Matsumoto et al. | 257/347 |
| 2004/0259315 A1 * | 12/2004 | Sakaguchi et al. | 438/285 |
| 2005/0079677 A1 * | 4/2005 | Ke et al. | 438/296 |
| 2005/0190421 A1 * | 9/2005 | Chen et al. | 359/211 |
| 2005/0242395 A1 * | 11/2005 | Chen et al. | 257/347 |

OTHER PUBLICATIONS

U.S. Office Action dated Feb. 25, 2009.
International Search Report dated Oct. 31, 2005.

* cited by examiner

*Primary Examiner* — H. Jey Tsai
(74) *Attorney, Agent, or Firm* — Joseph Petrokaitis, Esq.; McGinn IP Law Group, PLLC

(57) ABSTRACT

A method (and structure) of forming an electronic device includes forming at least one localized stressor region within the device.

19 Claims, 6 Drawing Sheets

METHOD AND STRUCTURE FOR STRAINED FINFET DEVICES

BACKGROUND OF INVENTION

The present invention generally relates to improving performance for devices such as FinFETs. More specifically, the present invention provides a method (and resultant structure) in which localized stressor areas allow carrier mobility in specific regions, such as the FinFET channel, to be separately adjusted for each device.

Double gate devices are considered a most suitable choice for next generation devices, since the improved short channel effect control and increased drive current that double gates deliver are needed. One of the most simple double gate devices to fabricate is the FinFET (Field Effect Transistor), due to the front gate and the back gate being self-aligned and the front gate oxide and back gate oxide being processed simultaneously.

FIG. 1 illustrates an exemplary FinFET structure 100 having a single Fin 101, source 102A, drain 102B, and gate 103, as fabricated on buried oxide (BOX) layer 104 on bulk silicon 105. Typically, there are multiple Fin structures in a FinFET joined by Fin connectors, in order to obtain the desired current, similar to increasing gate width W in planar devices.

FIG. 2 illustrates this exemplary FinFET structure 100 in cross-sectional view 200 through the gate 103. The height of the fin is arbitrary, and, as the height is lowered, the FinFET approaches the structure of a planar FET.

FinFETs are known to have improved scaling properties compared to single planar gate devices because the Fin-FET reduces the short channel effect as channel length is shortened. Strained Si offers improved performance over non-strained channel devices. However, strained Si by SiGe has been challenging to implement, and strained Si by SiGe is even more difficult to implement in FinFETs.

Another advantage of the FinFET is that, since the active areas are all substantially the same size in the length dimension, any stress enhancement in the direction along the current flow is potentially equal in magnitude for all devices. Thus, the mobility improvement and current increase should be substantially similar for all devices.

However, conventional methods to strain Si by SiGe to obtain improvement in nFETs cause more defects, thereby lowering yields. Moreover, it has been very difficult to realize any improvement in pFET performance using the strained Si by the SiGe technique. Therefore, there remains a need to improve performance and reduce costs for FinFETs.

SUMMARY OF INVENTION

In view of the foregoing, and other, exemplary problems, drawbacks, and disadvantages of the conventional system, it is a an exemplary feature of the present invention to provide a method and structure in which isolated stressors within a device allows each device to be individually tuned for carrier mobility.

It is another exemplary feature of the present invention to provide a technique in which carrier mobility can be enhanced in both pFET and nFET devices.

It is another exemplary feature of the present invention to provide an improved method of generating a stressed region without causing an increase in defects.

To achieve the above exemplary features and others, in a first exemplary aspect of the present invention, described herein is a method (and resultant structure) of forming an electronic device, including forming at least one localized stressor region within the device.

In a second exemplary aspect of the present invention, also described herein is a method of forming a stress region in an electronic device, including forming a first localized stressor region within the device and forming a second localized stressor region within the device, the first localized stressor region and second localized stressor region thereby causing a region therebetween to be stressed.

In a third exemplary aspect of the present invention, also described herein is an apparatus including at least one electronic device having a stressed region created by forming at least one localized stressor region within the device.

Thus, the present invention provides an improved method to provide stressed regions within a device, such that each device can be separately tuned to achieve an optimal stressed region.

BRIEF DESCRIPTION OF DRAWINGS

The foregoing and other exemplary features, aspects and advantages will be better understood from the following detailed description of an exemplary embodiment of the invention with reference to the drawings, in which.

DETAILED DESCRIPTION

Figure 1:
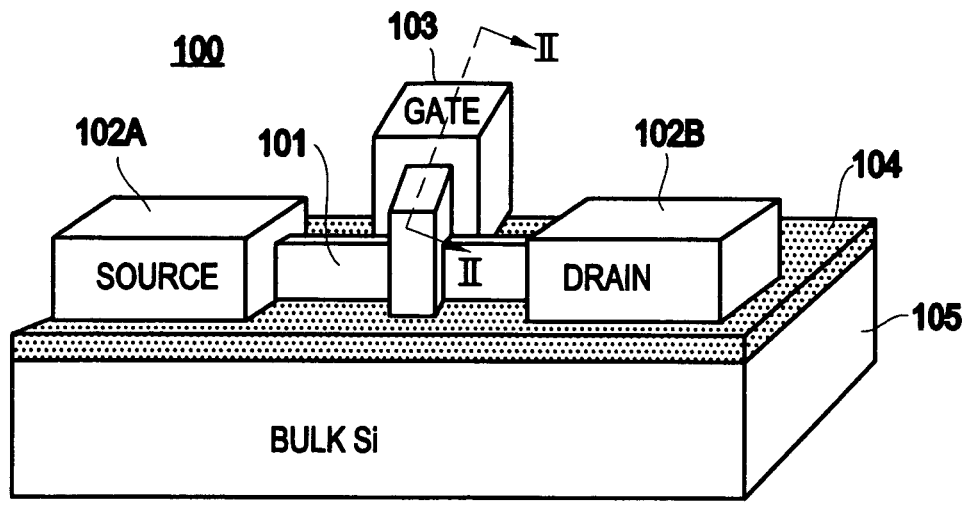
FIG. 1 shows an exemplary perspective view 100 of a conventional FinFET device having a single fin.
Figure 2:
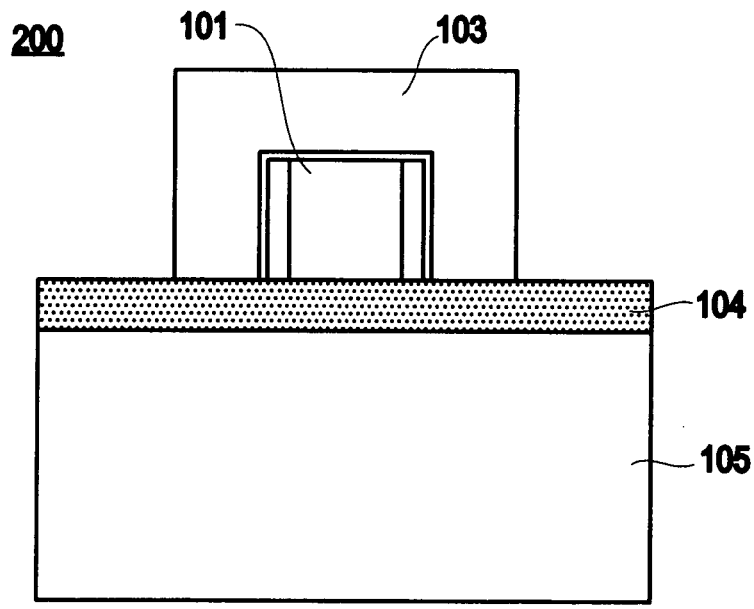
FIG. 2 shows the cross sectional view 200 of the conventional FinFET shown in FIG. 1.

Referring now to the drawings, and more particularly to FIGS. 3-10, an exemplary embodiment of the present invention will now be described.

In contrast to conventional techniques, the present invention is directed toward improving performance in FinFETs by using a local mechanical stress. The technique described herein overcomes challenges associated with conventional strained Si by SiGe. The method involves novel process steps to impose channel stress to improve mobility for both n- and p-type Fin channels. In the exemplary embodiment discussed below, the stress is locally created in the Fin connector structures, but it should be apparent to one of ordinary skill in the art, after taking the following discussion as a whole, that this concept is easily generalized to other devices and appropriate locations within these devices.

Figure 3:
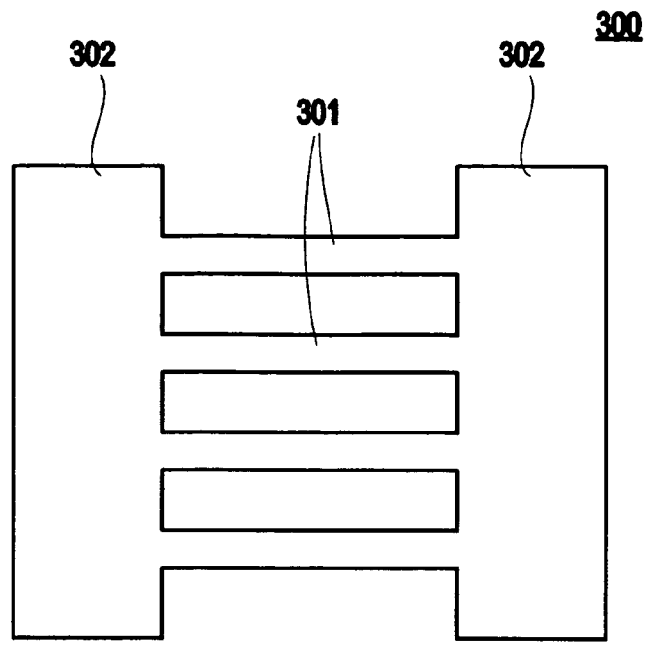
FIG. 3 exemplarily shows an early stage plan view 300 of an exemplary embodiment of the present invention.
Figure 4:
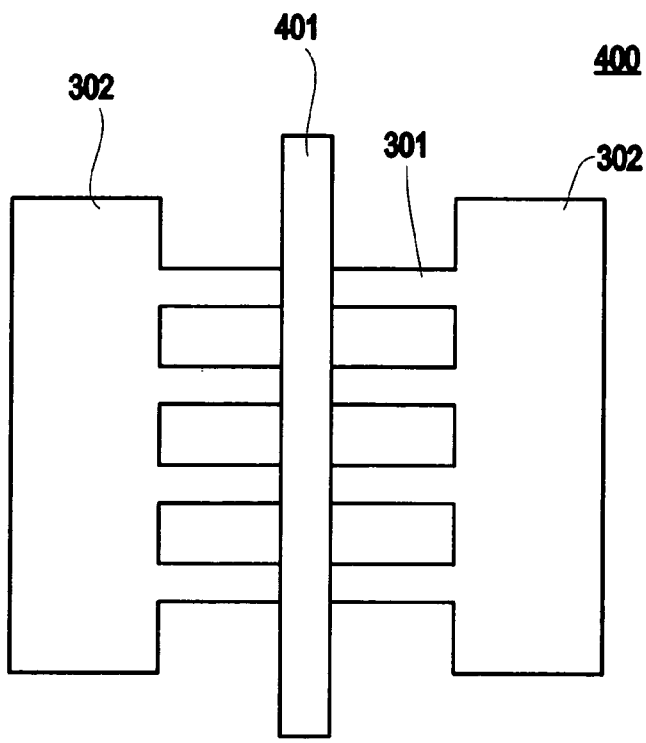
FIG. 4 exemplarily shows a plan view 400 in which the gate pattern has been formed.

A unique aspect of the FinFET is that, since all devices have the same width, FinFET circuits have a number of Fins to be connected. One method for connecting the Fins 301 is to define Si regions 302, as shown in FIG. 3. The present invention takes advantage of this particular configuration to improve carrier mobility in the channel by using local mechanical stress.

It has been very difficult to realize any improvement in pFET performance using the strained Si by the SiGe technique. However, the mechanical stress technique taught by the present invention can also result in pFinFET performance improvement.

FIG. 3 shows an SOI wafer in a plan view 300. The SOI layer is about 800 Å in thickness. Next, an oxide hard mask of about 400 Å(e.g., exemplarily, in a range of 300 Å-500 Å) is formed by thermal oxidation of the SOI wafer. Next the active regions are patterned by lithography and etching. The fins 301 are connected together by the fin connectors (Si regions) 302.

Well implants may be implanted and annealed, followed by gate oxidation. The gate electrode 401 is patterned by first depositing a gate material like poly-Si. The poly-Si can be planarized by CMP, after which a lithography and etch process is carried out. The structure appears as shown in the plan view 400 of FIG. 4. Amorphous Si can also be used, but this material will recrystallize after the annealing. Metal can also be used for the gate, but would be more difficult to etch.

Figure 5:
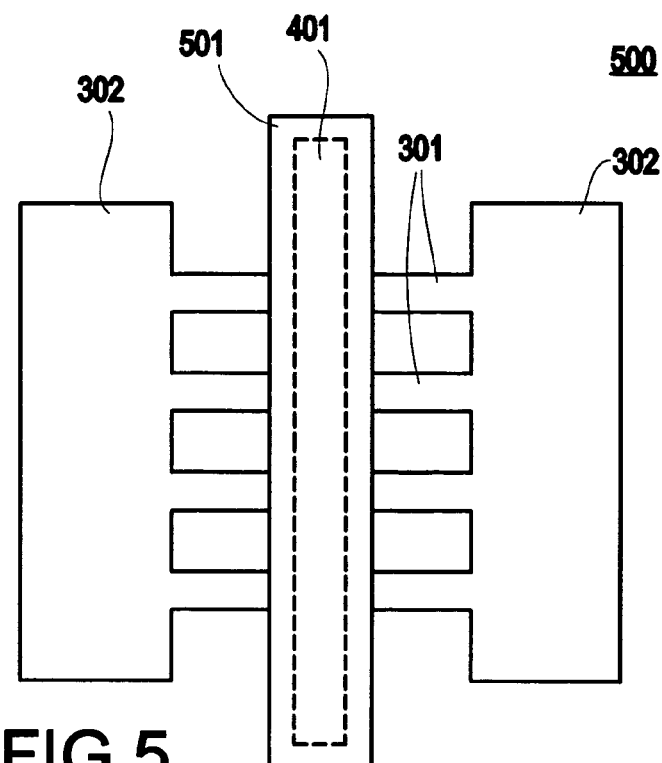
FIG. 5 exemplarily shows a plan view 500 in which the source/drain spacers have been formed.

The extensions (not shown in the figures) are implanted, using an ion implantation process. Preferably, As and/or P are used for nFinFETs and B and/or $BF_2$ are used as ions for implants for pFinFETs. A plan view 500 of FIG. 5 shows that the source/drain spacers 501 are next formed by depositing an oxide liner (e.g., silicon oxide) followed by depositing a SiN layer of about 500 Å. Depending on the scaling, the range of the SiN layer might be anywhere in the 200 Å 600 Å. A directional etch is then used to form the spacers 501. After spacer formation, source-drain implants are performed using an ion implantation process with dopants similar to that just described above. Raised source drains (not shown in the figures) are grown by selective epitaxial Si. Silicide (also not shown in the figures) is formed by reacting metal like, for example, Co, Ti, or Ni, or alloys or combinations thereof, with the exposed Si.

Figure 6:
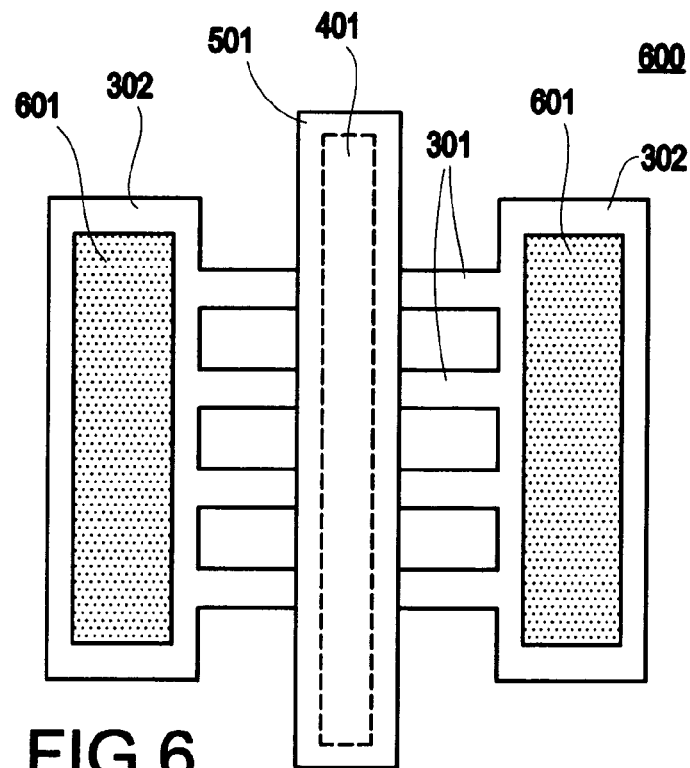
FIG. 6 exemplarily shows a plan view 600 in which compressive material has been formed on the Fin connectors, as would be appropriate for a pFinFET.

FIG. 6 shows a plan view 600 as the stressors are placed in the device. A dielectric film of thickness in a range of 2000 Å 5000 Å, with about 5000 Å being preferred, is next deposited and planarized by CMP. The dielectric film may be BPSG (Boron Phosphorous Silicate Glass), HDP (High Density Plasma) oxide, and/or TEOS (Tetraethylorthosilicate). A lithography and etch process used to open the shaded regions 601 of the fin connectors 302. In the case of the pFinFET, the Si region of the connector may be etched and filled with a compressive material. One choice for the compressive material is compressive SiN. Another choice is to silicide the open hole, without etching the Si region, using a highly compressive silicide, such as PdSi, Pt silicide, or the like.

It is noted that the compressive material need not be conductive. That is, a purpose of the compressive material is to impart compressive stress to the channel region of the device. If the channel region is small and the compressive material has sufficient volume and is sufficiently close to the channel region (e.g., within about 0.5 microns, as in the simulation example shown in FIG. 9), then a significant amount of stress of the order of 1000 MPa or more may be transferred to the channel region. This will have a mobility enhancement of greater than 70%.

Figure 7:
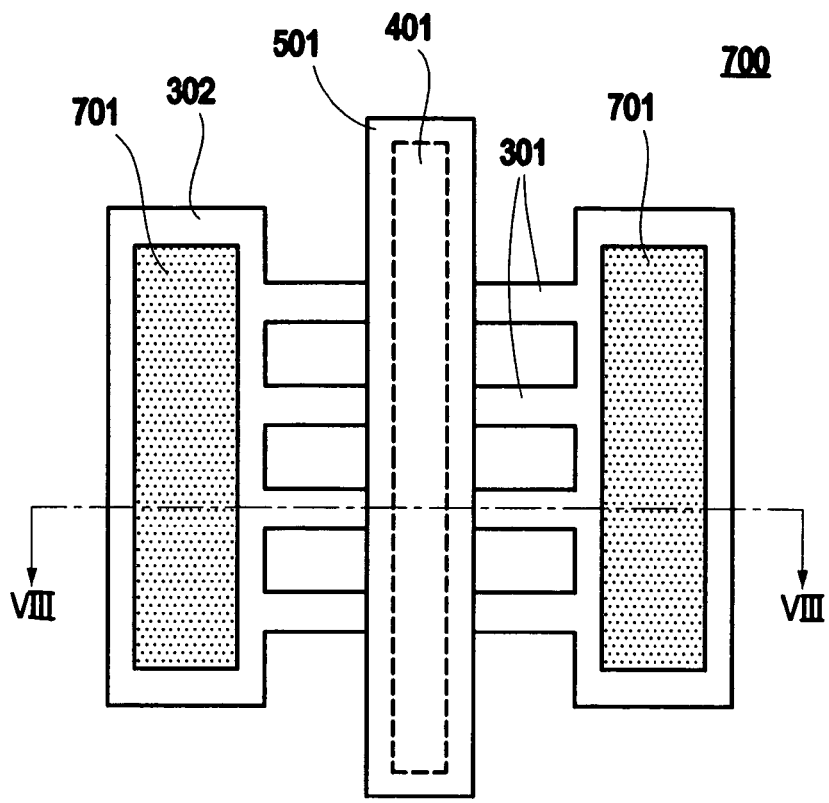
FIG. 7 exemplarily shows a plan view 700 in which tensile material has been formed on the Fin connectors, as would be appropriate for an nFinFET.

FIG. 7 shows a corresponding plan view 700 for an nFinFET device. A similar lithography and etch process is used to open the shaded regions 701 of the nFin connectors 302. In the case of the nFinFET, the Si region of the connector may be etched and filled with a tensile material. One choice for the tensile material is tensile SiN. Another choice is to silicide the open hole, without etching the Si region, using a highly tensile silicide like, for example, $CoSi_2$ silicide.

Again, similar to the compressive material above, the tensile material need not be conductive, since its purpose is to impart tensile stress to the channel. If the channel regions are small, and the tensile material has sufficient volume and is sufficiently close (e.g., within 0.5 µm) to the channel region, then a significant amount of stress of the order of +1000 MPa or more may be transferred to the channel region. This will have a mobility enhancement of greater than 70%.

Figure 8:
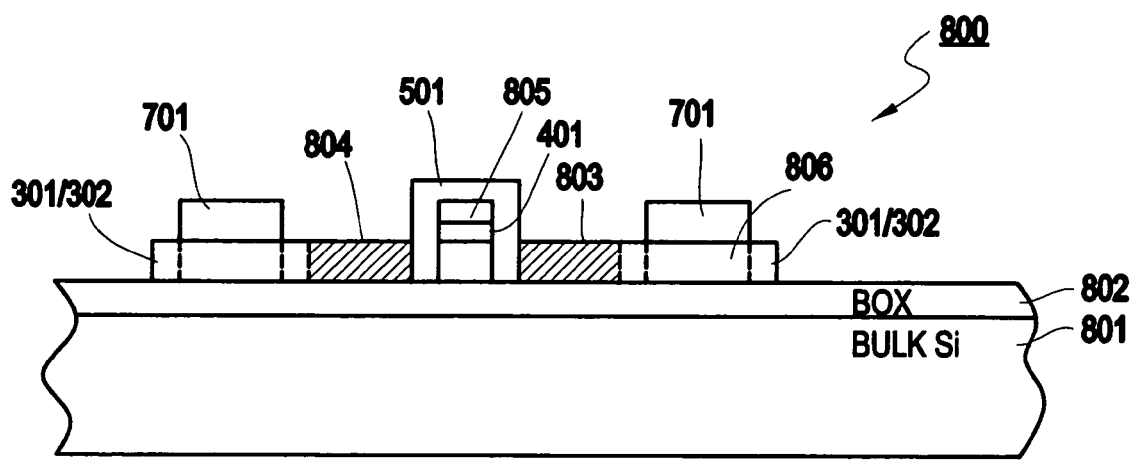
FIG. 8 shows the cross-sectional view 800 of the device shown in FIG. 7.

FIG. 8 shows the cross-section view 800 of the device shown in FIG. 7, including the bulk silicon 801, BOX layer 802, fin 301, fin connector 302, source/drain implant region 803, 804, poly-Si gate 401, source/drain spacer 501, stressor regions 701, and hard mask 805 for forming the gate structure. As shown by dotted region 806, in an exemplary embodiment, the stressors 701 extend down to the level of the BOX layer 802.

Figure 9:
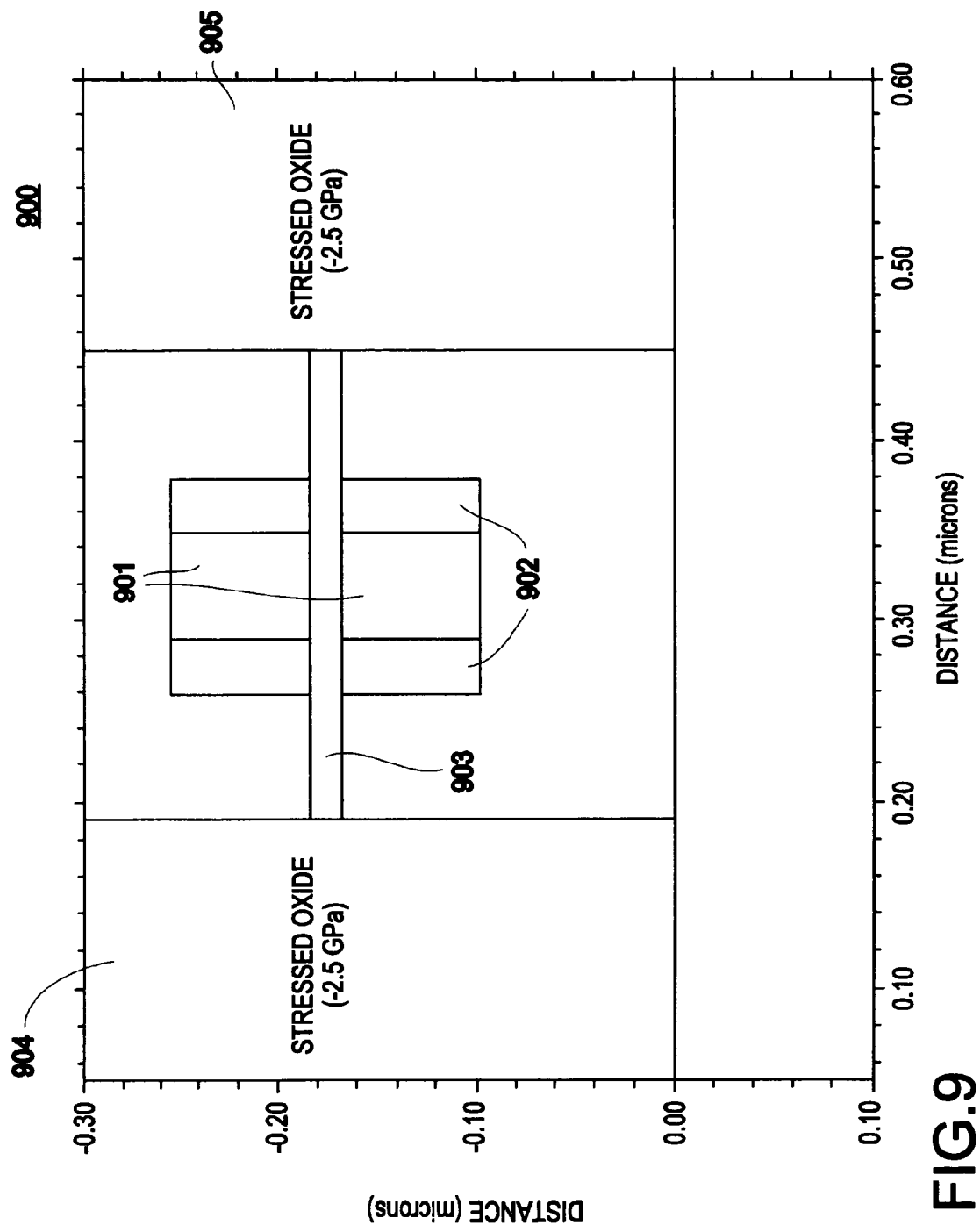
FIG. 9 shows a plan view 900 of an exemplary FinFET structure used for simulation of the present invention.
Figure 10:
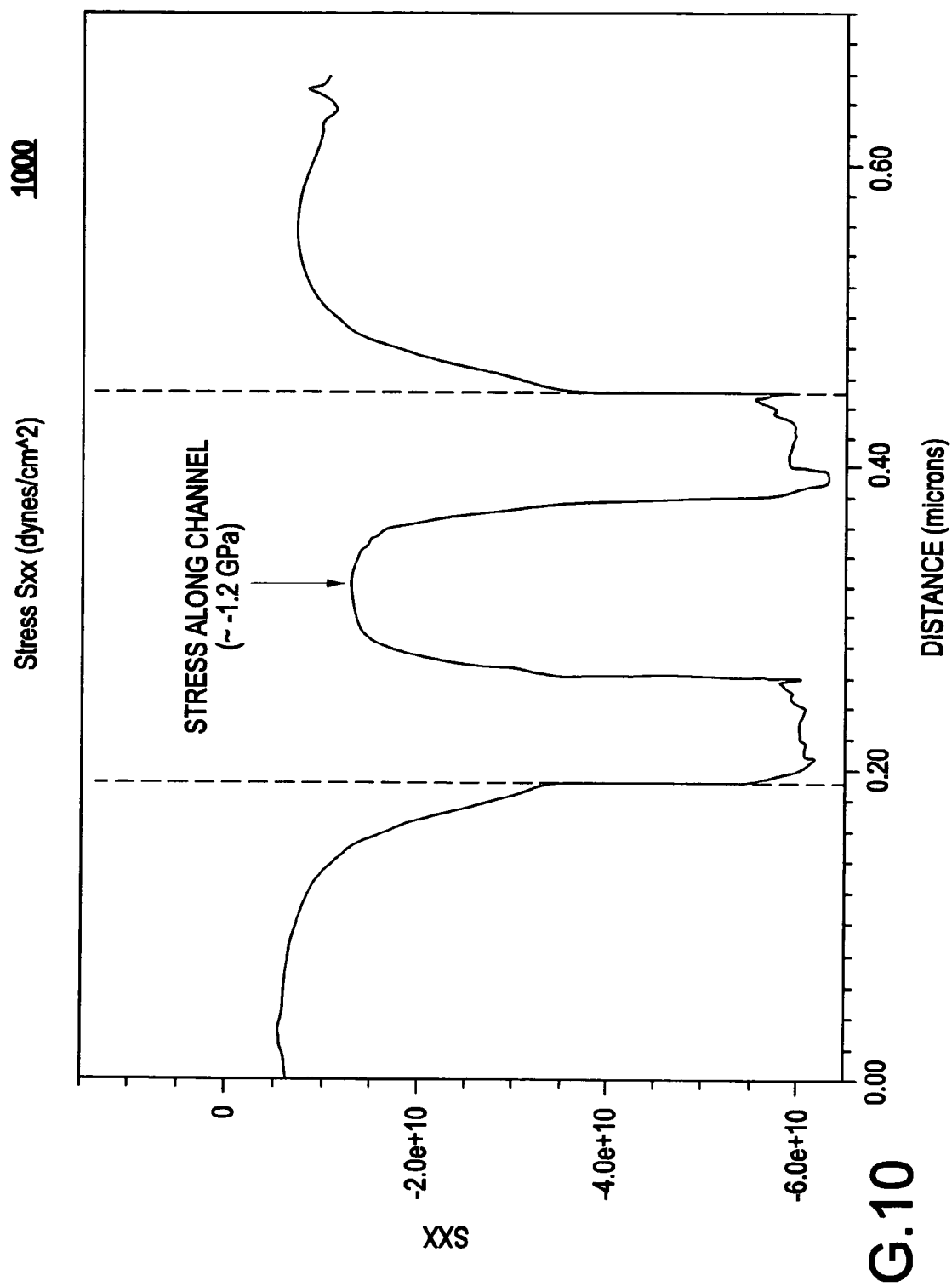
FIG. 10 shows the simulation result 1000 for the FinFET structure that is shown in FIG. 9.

FIGS. 9 and 10 show a simulation result 1000 for a FinFET 900 constructed in accordance with the present invention and provides indication of the dimensions involved when using current technology. However, it should be noted that the present invention is a generic concept that is not constrained by the dimensions and layout of the exemplary device shown in these figures, as would be evident to one of ordinary skill in the art, taking the present application as a whole.

The gate 901 in FIG. 9 is exemplarily a double poly-Si gate, and the nitride spacers 902 have an exemplary thickness of approximately 30 nm. The Si fin 903 has a width of approximately 15 nm. The two stressors 904, 905 are each exemplarily stressed causing stress of approximately −2.5 GPa.

FIG. 10 shows a simulation result 1000 of the stress along the channel as being approximately −1.2 GPa. Thus, as clearly seen in FIG. 10, the two stressors 904, 905 work together to create a stress in the channel region. It should also be clear that the stressors could be used either to generate a compression stress or to generate a tensile stress, depending upon whether a compressive material or a tensile material is used as the stressor material.

It should be apparent to one of ordinary skill in the art, after taking the present disclosure as a whole, that the present invention can be used to separately "tune" individual devices.

That is, in the conventional method of growing Si on SiGe for stress causes tension in both the parallel and perpendicular dimensions in the channel. This effect is good for improvement for nFETs. However, pFETs require tension perpendicular to current flow but compression parallel to current flow.

In contrast, using the localized stressors of the present invention, a uni-axial stress can be created within each device. Therefore, one device's performance can be improved separately (independently) with compression stress (e.g., pFETs), while another device's performance could be improved with tensile stress (e.g., nFETs).

FIG. 10 also demonstrates that distance between stressors and the stressor composition and structure become parameters for tuning a device. However, the effects of these parameters are easily simulated, as demonstrated in FIG. 10, so that one of ordinary skill would be able to vary parameters systematically to determine the specific values required for each situation and desired application.

It is noted that one of ordinary skill in the art, after having read the details described herein, would readily be able to apply the present invention as a generic concept of applying stressors, as being localized regions of compressive or tensile materials within a device, that work together to provide a stress within a region, such as the channel region of a FinFET device.

Thus, it should be apparent to one of ordinary skill in the art, after taking this discussion as a whole, that the concept of the present invention could be adapted to any device being fabricated for which carrier mobility modification is desired and that each such device can be separately (independently) tuned by choice of stressor material, distance between stressors, and masking of devices of the circuit not selected to receive carrier mobility modification.

It is noted that the type of device for which the localized stressors described herein is not intended as being limited to the exemplary FinFET structures and to the location on the fin connectors. The stressors could have been located, for example, on the source/drain regions, etc., of the exemplary FinFET structure, in order to decrease the separation between stressors, thereby enhancing the stress effect of the two stressors.

More specifically, placing the stressors on the source/drain makes the present invention applicable to planar FET structures that do not have the FinFET fin connectors. However, it is also noted that the present invention is not intended as limited to FET-type structures, since it is clearly applicable in a broader environment because of its ability to provide a uni-axial stress region between any of two localized stressors. In general, the localized stressors of the present invention can be considered as a method of either increasing or decreasing mobility of charge carriers in the region between the stressors. This more generalized definition makes the present invention applicable in devices having either holes as charge carriers (e.g., pMOS-like devices) or having electrons as charge carriers (e.g., nMOS-type devices).

It is further noted that, although the present invention exemplarily demonstrates the incorporation of symmetrical localized stressors, it is also not intended as being limited to this exemplary embodiment. That is, one of ordinary skill in the art, having taken the discussion herein as a whole, will readily recognize that the present invention teaches the technique of incorporating a localized region (e.g., within a device) configured to serve as a localized stressor. The localized stressor could be incorporated in a number of variations and shapes of configurations.

As possible non-limiting variations, a single localized stressor could be incorporated within a device and not be interacting with any other stressor, thereby creating an asymmetrically stressed area. A single localized stressor could be incorporated with a non-localized stressor, thereby providing a stressor that covers an area larger than a single device. A localized stressor could be incorporated in one device and interact with a localized stressor in a second device. Two localized stressors could be interacting with each other, each being the same or different types (e.g., compressive or tensile) or having different (or the same) degrees of stress or materials, depending on the designer's applications and requirements.

Finally, it is also noted the number of stressors that are effectively interacting is not limited to the two exemplary localized stressors discussed above. That is, additional stressors could be located as interacting to create a complex three-dimensional stress field between the stressors.

While the invention has been described in terms of exemplary embodiments, those skilled in the art will recognize that the invention can be practiced with modification within the spirit and scope of the appended claims.

Further, it is noted that Applicants' intent is to encompass equivalents of all claim elements, even if amended later during prosecution.

The invention claimed is:

1. A method of forming an electronic device, said device comprising a FinFET (Fin Field Effect Transistor) containing a plurality of fins interconnected by fin connectors, said method comprising:
   forming at least one localized stressor region within said device, said at least one localized stressor region being located on one of said fin connectors as a region of stressor material filling in an interior portion of said fin connector.

2. The method of claim 1, wherein said at least one localized stressor region comprises a first localized stressor region, said method further comprising:
   forming a second localized stressor region within said device,
   said first localized stressor region and said second localized stressor region causing a region therebetween to be stressed.

3. The method of claim 2, wherein said first localized stressor region and said second localized stressor region comprise a same type material.

4. The method of claim 3, wherein said same type material comprises one of a compressive stressor material and a tensile stressor material.

5. The method of claim 2, wherein said first and second localized stressor regions are formed on said fin connectors of said FinFET as regions of stressor material filling in interior portions of respective two fin connectors.

6. The method of claim 4, wherein said same type material comprises a compressive material and primary charge carriers in said region being stressed comprise holes.

7. The method of claim 4, wherein said same type material comprises a tensile material and primary charge carriers in said region being stressed comprise electrons.

8. The method of claim 2, wherein said region being stressed causes a carrier mobility in said stressed region to be one of increased and decreased, relative to a carrier mobility in a region without said stress.

9. The method of claim 1, wherein said device comprises one of a plurality of devices in an electronic circuit, said method further comprising:
   selectively providing a blocking mask over devices in said electronic circuit which are not to receive said at least one localized stressor region.

10. A method of forming a stress region in an electronic device, said device comprising a FinFET (Fin Field Effect Transistor) containing a plurality of fins interconnected by fin connectors, said method comprising:
    forming a first localized stressor region within said device on a first fin connector as comprising a first region of stressor material filling in an interior portion of said first fin connector; and
    forming a second localized stressor region within said device on a second fin connector as comprising a second region of stressor material filling in an interior portion of said second fin connector,
    said first localized stressor region and said second localized stressor region causing a region therebetween to be stressed.

11. The method of claim 10, wherein said region being stressed causes a carrier mobility in said stressed region to be one of increased and decreased, relative to a carrier mobility in a region without said stress.

12. The method of claim 1, wherein at least one of said at least one localized stressor region interacts with a stressed region located outside said device.

13. The method of claim 1, wherein said at least one localized stressor region is used to generate one of a compression stress and a tensile stress.

14. The method of claim 1, wherein said at least one localized stressor region is located within said device to generate a stress that enhances a performance of said device.

15. The method of claim 14, wherein said performance enhancement comprises an increase in a carrier mobility.

16. The method of claim 14, wherein said performance enhancement comprises a decrease in a carrier mobility.

17. The method of claim 1, wherein said at least one localized stressor region is located to generate a stressed region in at least one of a direction parallel to a current flow and perpendicular to a current flow.

18. The method of claim 1, wherein said at least one localized stressor region is used to create a symmetrically stressed region.

19. The method of claim 1, wherein said at least one localized stressor region is used to create an asymmetrically stressed region.

* * * * *